US011818954B2

(12) United States Patent
Furuya

(10) Patent No.: US 11,818,954 B2
(45) Date of Patent: Nov. 14, 2023

(54) METHOD OF MANUFACTURING PIEZOELECTRIC ACTUATOR, PIEZOELECTRIC ACTUATOR, AND ROBOT

(71) Applicant: SEIKO EPSON CORPORATION, Tokyo (JP)

(72) Inventor: Noboru Furuya, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 64 days.

(21) Appl. No.: 17/481,332

(22) Filed: Sep. 22, 2021

(65) Prior Publication Data

US 2022/0093846 A1    Mar. 24, 2022

(30) Foreign Application Priority Data

Sep. 23, 2020    (JP) ................. 2020-158306

(51) Int. Cl.
  *H10N 30/082*    (2023.01)
  *H01L 21/66*    (2006.01)
  *H10N 30/078*    (2023.01)
  *H10N 30/87*    (2023.01)

(52) U.S. Cl.
  CPC .......... *H10N 30/082* (2023.02); *H01L 22/12* (2013.01); *H10N 30/078* (2023.02); *H10N 30/871* (2023.02)

(58) Field of Classification Search
  CPC ... H01L 41/332; H01L 22/12; H01L 41/0471; H01L 41/318; H01L 41/1876
  See application file for complete search history.

(56) References Cited

U.S. PATENT DOCUMENTS

| 2008/0062230 | A1 | 3/2008 | Nozu et al. | |
| 2016/0049887 | A1* | 2/2016 | Miyazawa | H02N 2/004 |
| | | | | 318/116 |
| 2017/0092840 | A1* | 3/2017 | Itayama | B41J 2/1645 |
| 2018/0069168 | A1* | 3/2018 | Ikeuchi | H01L 41/314 |
| 2018/0076381 | A1 | 3/2018 | Furuya et al. | |
| 2018/0091067 | A1* | 3/2018 | Kobayashi | H01L 41/332 |
| 2018/0154652 | A1* | 6/2018 | Yazaki | B41J 2/055 |

(Continued)

FOREIGN PATENT DOCUMENTS

| CN | 104810469 B | * | 9/2017 | .......... B41J 2/14201 |
| JP | H11277754 A | * | 10/1999 | |
| JP | 2002173770 A | | 6/2002 | |

(Continued)

*Primary Examiner* — Peter Dungba Vo
*Assistant Examiner* — Jose K Abraham
(74) *Attorney, Agent, or Firm* — Yu Gang

(57) ABSTRACT

A method of manufacturing a piezoelectric actuator includes preparing a laminate including a substrate, a first electrode layer disposed on the substrate, a piezoelectric layer disposed on the first electrode layer, and a second electrode layer disposed on the piezoelectric layer, and forming a contour shape of the piezoelectric layer. The forming of the contour shape includes dry etching the piezoelectric layer from the second electrode layer side to dig the piezoelectric layer halfway in a thickness direction, covering, with a resist film, a dry etched surface formed on a side surface of the piezoelectric layer by the dry etching, and wet etching the piezoelectric layer from the second electrode layer side to dig the piezoelectric layer until the first electrode layer is reached.

8 Claims, 16 Drawing Sheets

(56) References Cited

U.S. PATENT DOCUMENTS

2019/0103550 A1* 4/2019 Kobayashi ................ B25J 9/12

FOREIGN PATENT DOCUMENTS

| | | | |
|---|---|---|---|
| JP | 2008087469 A | | 4/2008 |
| JP | 2016174023 A | | 9/2016 |
| JP | 2018037829 A | * | 3/2018 |
| WO | WO-2020121804 A1 | * | 6/2020 |

* cited by examiner

METHOD OF MANUFACTURING PIEZOELECTRIC ACTUATOR, PIEZOELECTRIC ACTUATOR, AND ROBOT

The present application is based on, and claims priority from JP Application Serial Number 2020-158306, filed Sep. 23, 2020, the disclosure of which is hereby incorporated by reference herein in its entirety.

BACKGROUND

1. Technical Field

The present disclosure relates to a method of manufacturing a piezoelectric actuator, a piezoelectric actuator, and a robot.

2. Related Art

For example, JP-A-2002-173770 describes a method of manufacturing an inkjet head. The manufacturing method includes: a step of forming individual electrodes on a substrate 41, forming piezoelectric thin films on the individual electrodes, and obtaining a laminate in which a common electrode is formed on the piezoelectric thin films; and a step of dividing the individual electrode and the piezoelectric thin film for each of pressure chambers 3 by a dry etching method such as an ion milling method or a reactive ion etching method, and removing unnecessary portions of the common electrode.

However, in the manufacturing method described in JP-A-2002-173770, since the common electrode is also etched by dry etching, a part of the common electrode may be unintentionally removed, resulting in an increase in resistance value, wire-breakage, or the like. Therefore, when a piezoelectric actuator is manufactured by the manufacturing method described in JP A-2002-173770, there is a problem that electrical characteristics of a manufactured product easily deviate from designed characteristics.

SUMMARY

A method of manufacturing a piezoelectric actuator according to an application example includes: preparing a laminate including a substrate, a first electrode layer disposed on the substrate, a piezoelectric layer disposed on the first electrode layer, and a second electrode layer disposed on the piezoelectric layer; and forming a contour shape of the piezoelectric layer, in which the forming of the contour shape includes dry etching the piezoelectric layer from the second electrode layer side to dig the piezoelectric layer halfway in a thickness direction, covering, with a resist film, a dry etched surface formed on a side surface of the piezoelectric layer by the dry etching, and wet etching the piezoelectric layer from the second electrode layer side to dig the piezoelectric layer until the first electrode layer is reached.

A piezoelectric actuator according to an application example includes: a substrate; a first electrode disposed on the substrate; a piezoelectric body disposed on the first electrode; and a second electrode disposed on the piezoelectric body, in which the piezoelectric body includes a dry etched portion whose side surface is a dry etched surface, and a wet etched portion which is located on the first electrode side with respect to the dry etched portion and whose side surface is a wet etched surface.

A robot according to an application example includes the above-described piezoelectric actuator.

DESCRIPTION OF EXEMPLARY EMBODIMENTS

Hereinafter, a method of manufacturing a piezoelectric actuator, a piezoelectric actuator, and a robot according to the present disclosure will be described in detail based on preferred embodiments shown in the accompanying drawings.

First Embodiment

Figure 1:
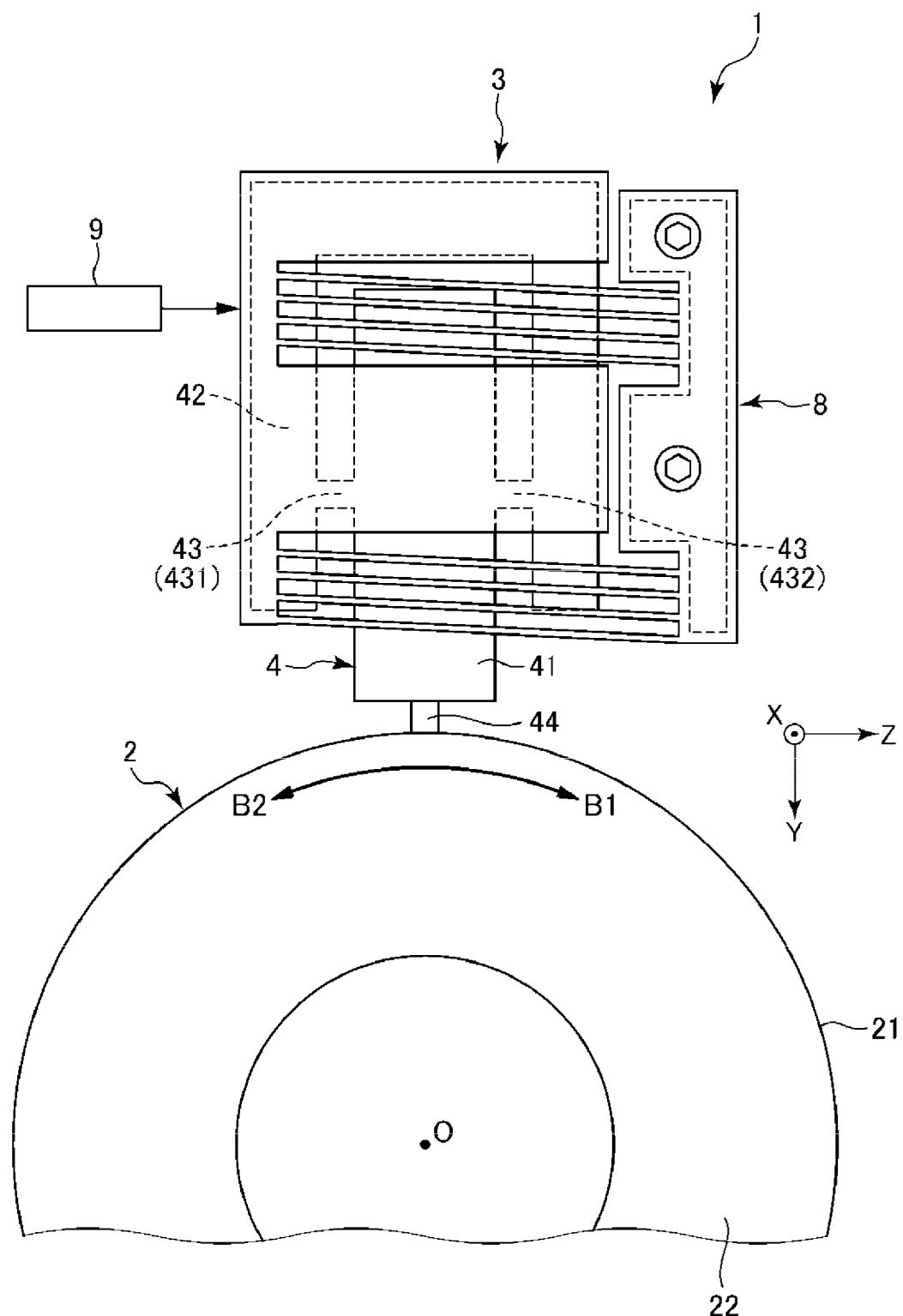
FIG. 1 is a plan view showing a piezoelectric motor according to a first embodiment of the present disclosure.
Figure 2:
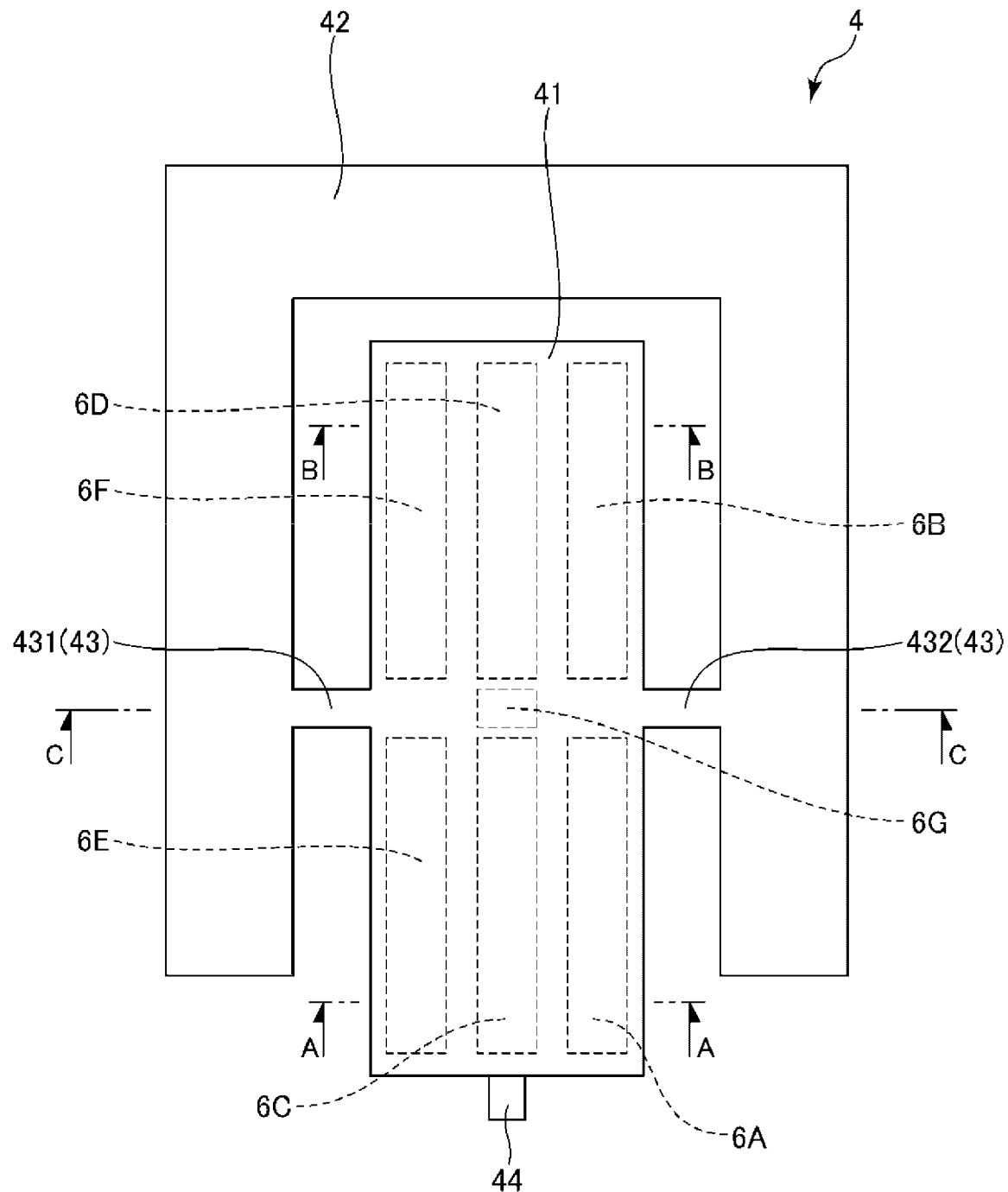
FIG. 2 is a plan view showing a piezoelectric actuator included in the piezoelectric motor.
Figure 2:
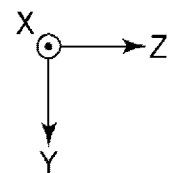
Figure 3:
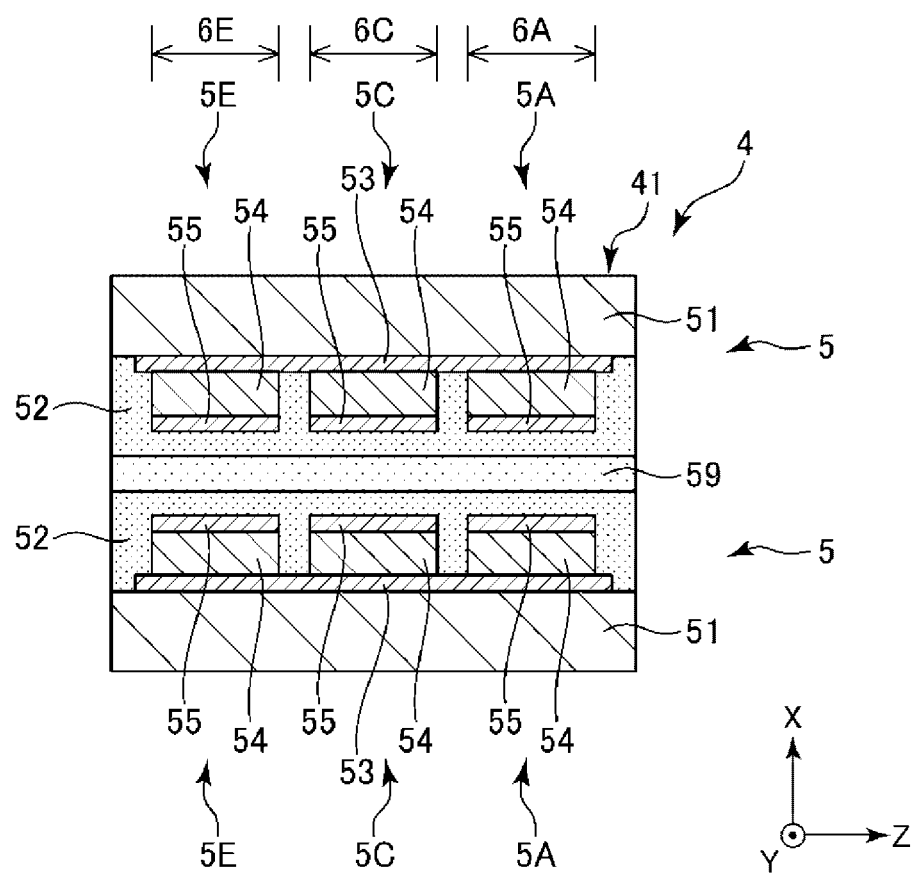
FIG. 3 is a cross-sectional view taken along a line A-A in FIG. 2.
Figure 4:
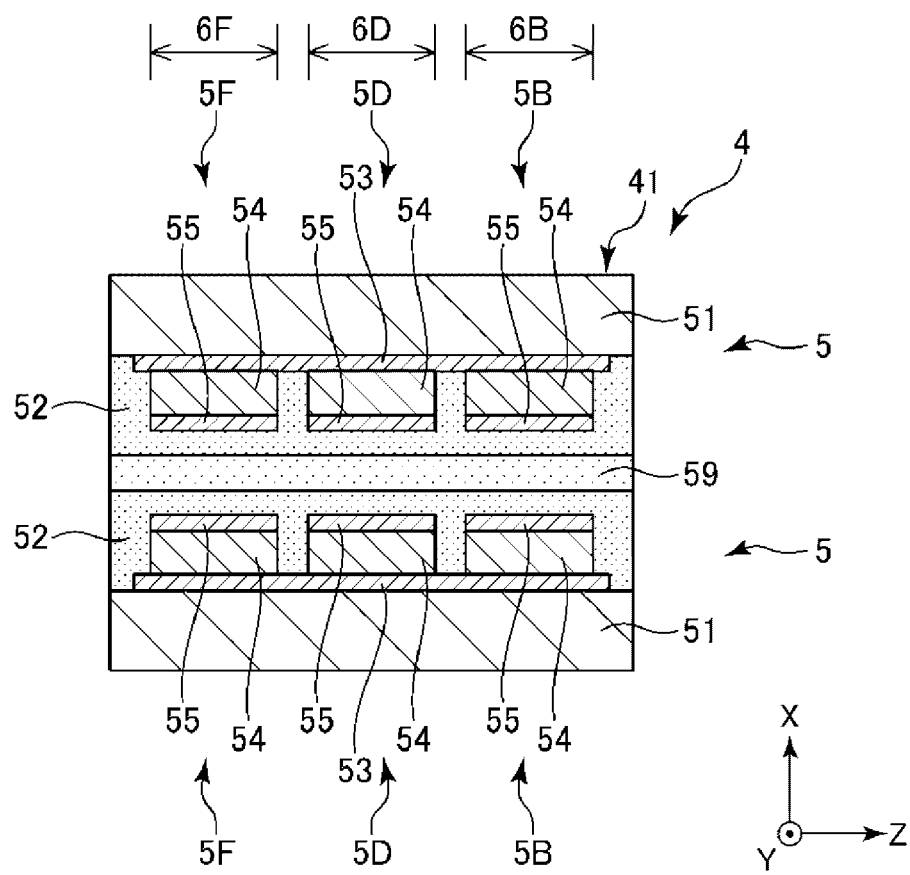
FIG. 4 is a cross-sectional view taken along a line B-B in FIG. 2.
Figure 5:
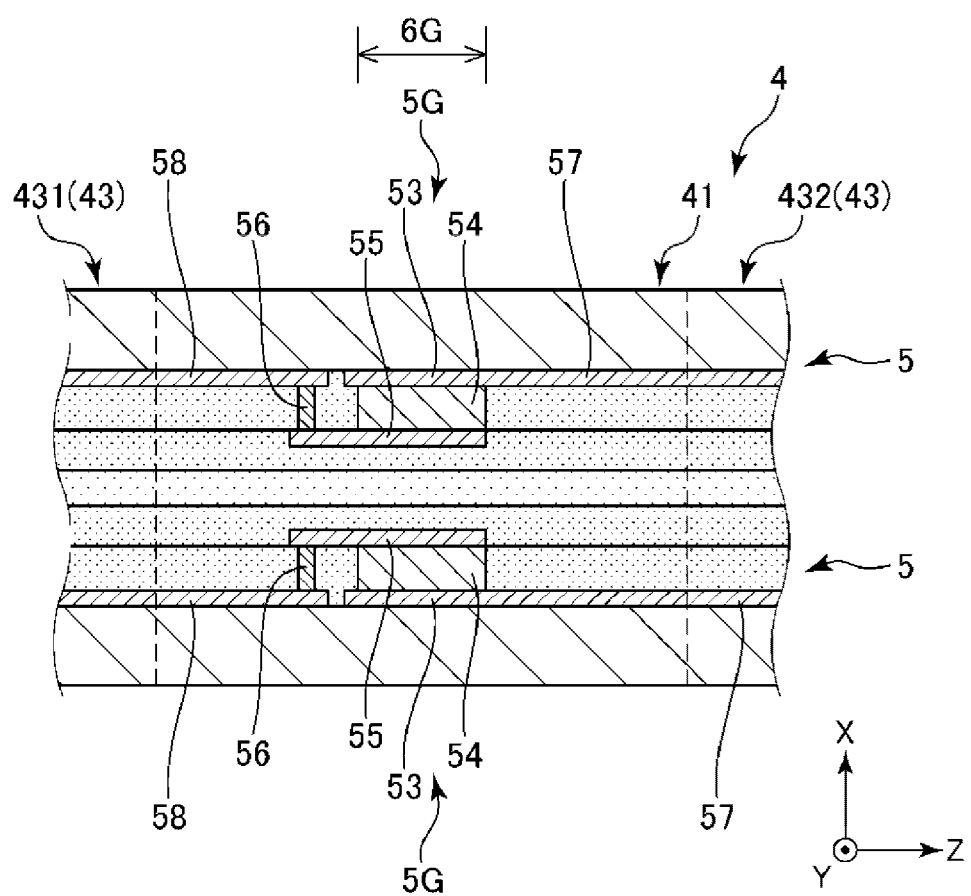
FIG. 5 is a cross-sectional view taken along a line C-C in FIG. 2.
Figure 6:
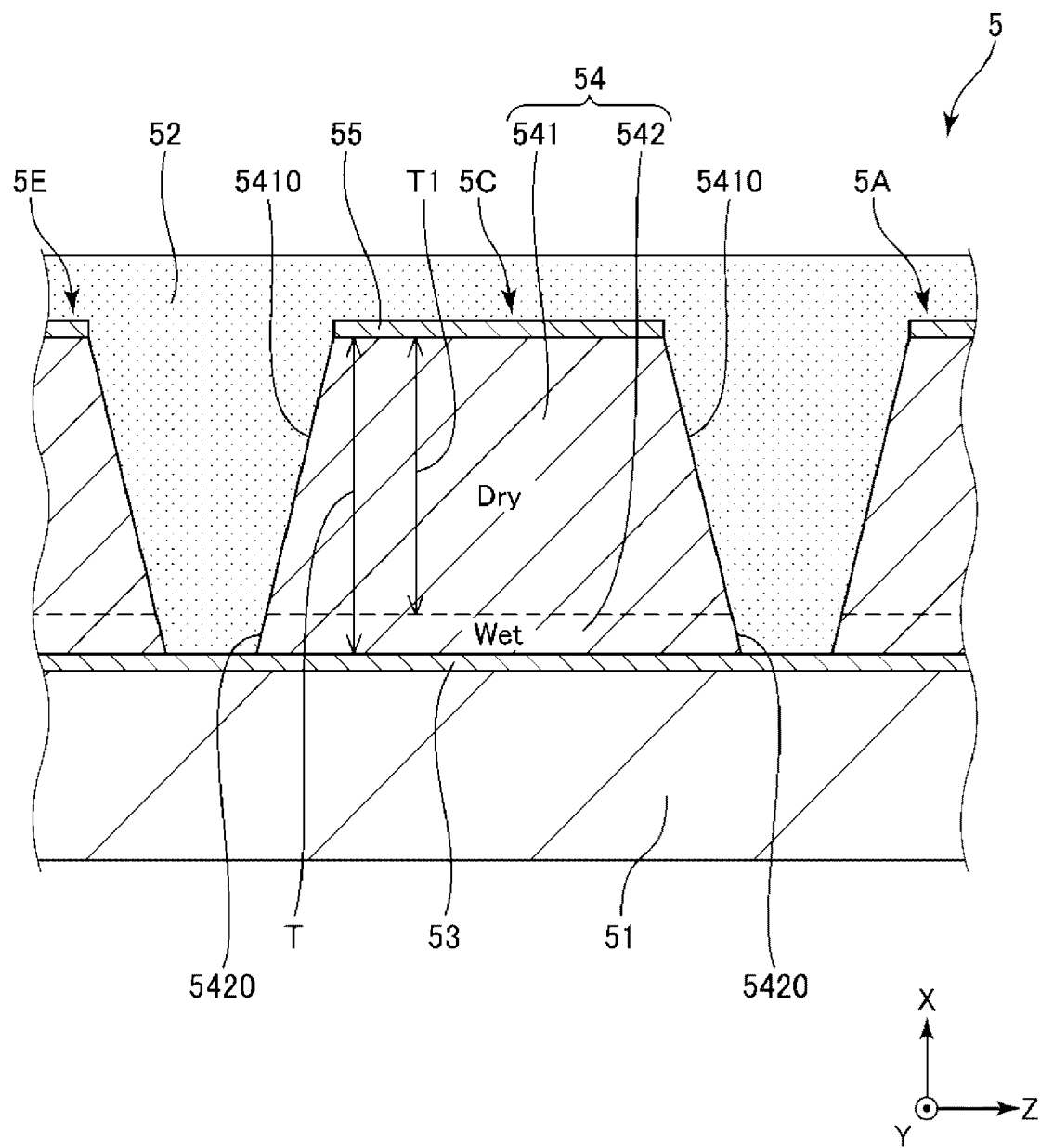
FIG. 6 is a cross-sectional view showing a piezoelectric element included in the piezoelectric actuator.
Figure 7:
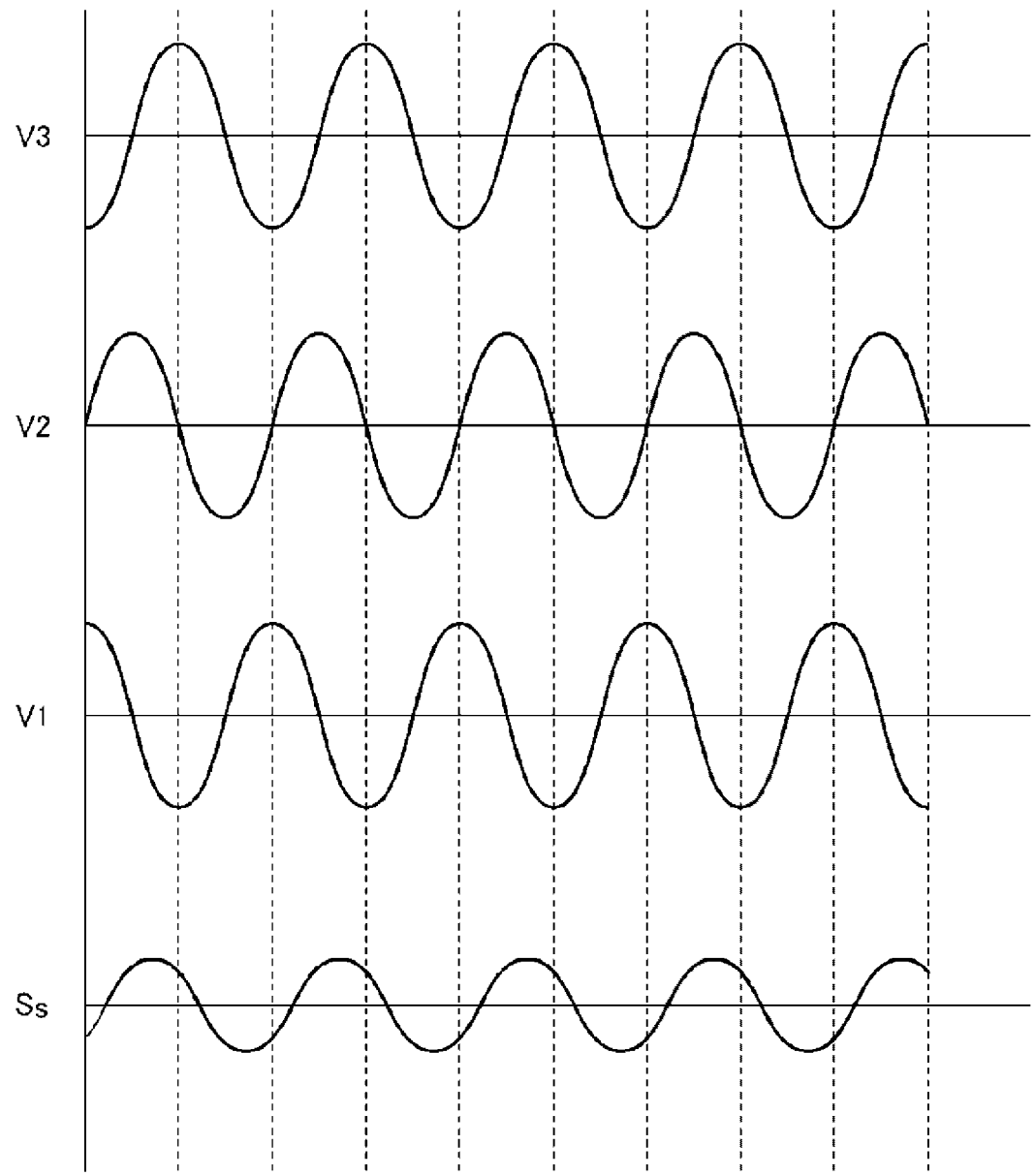
FIG. 7 is a diagram showing a signal applied to the piezoelectric actuator.
Figure 8:
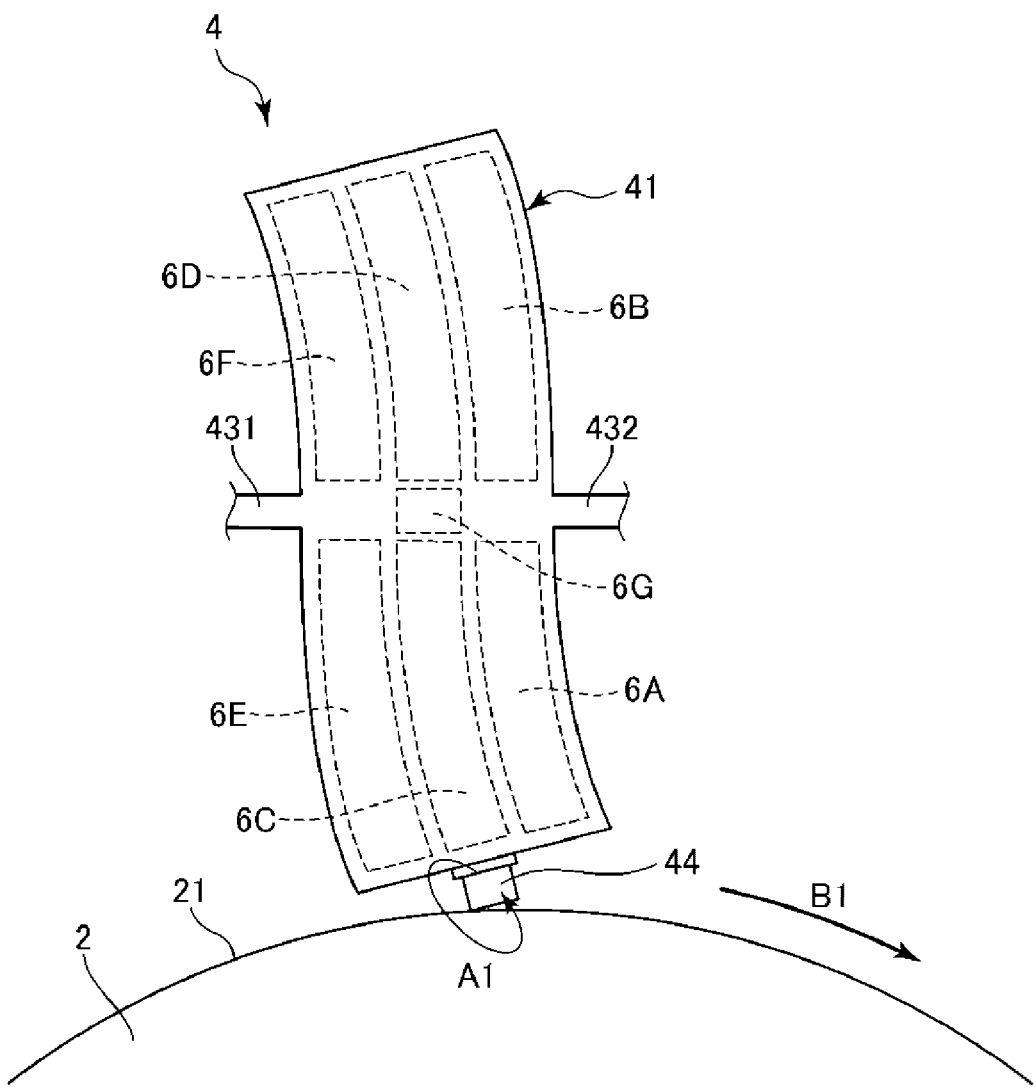
FIG. 8 is a plan view showing a driving state of the piezoelectric actuator.
Figure 8:
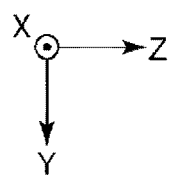
Figure 9:
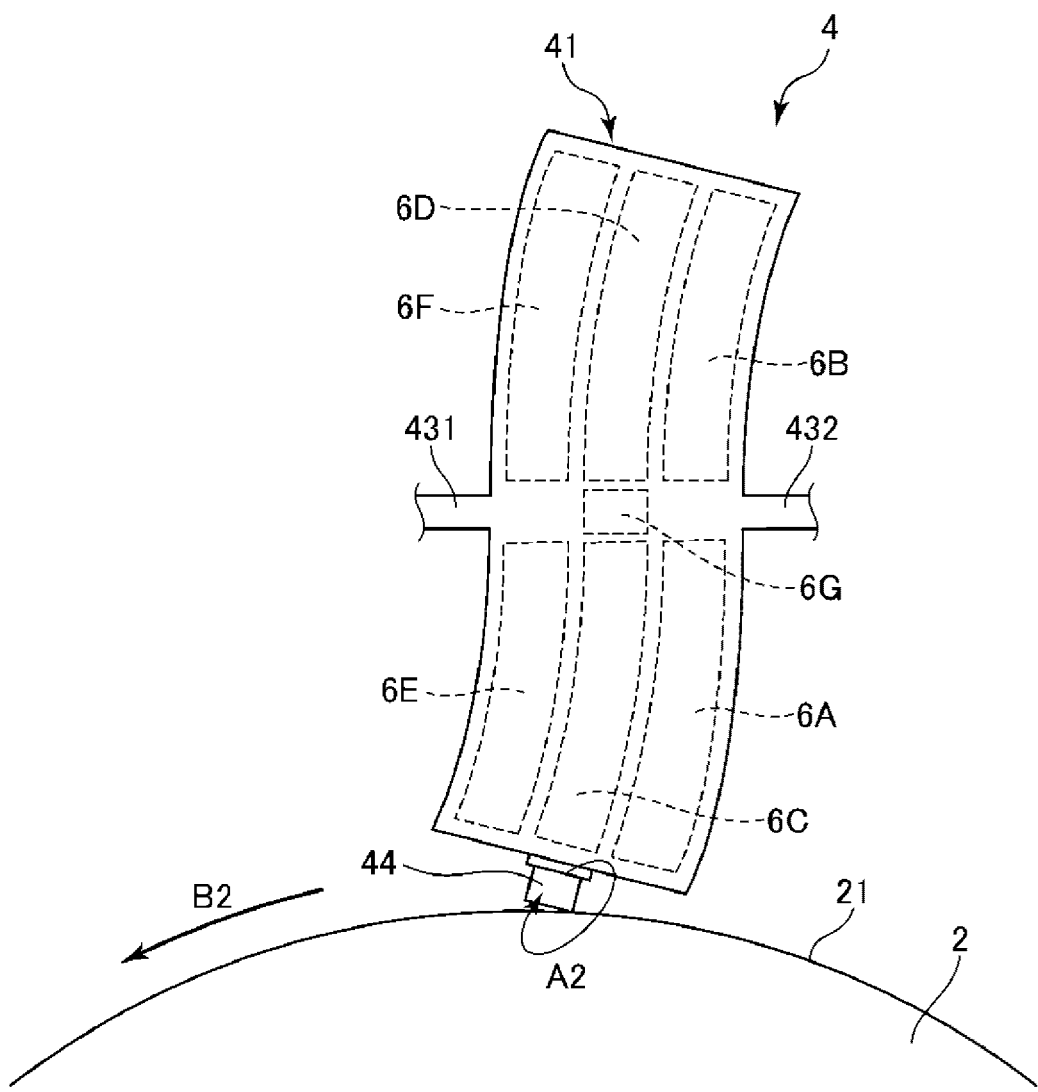
FIG. 9 is a plan view showing the driving state of the piezoelectric actuator.
Figure 10:
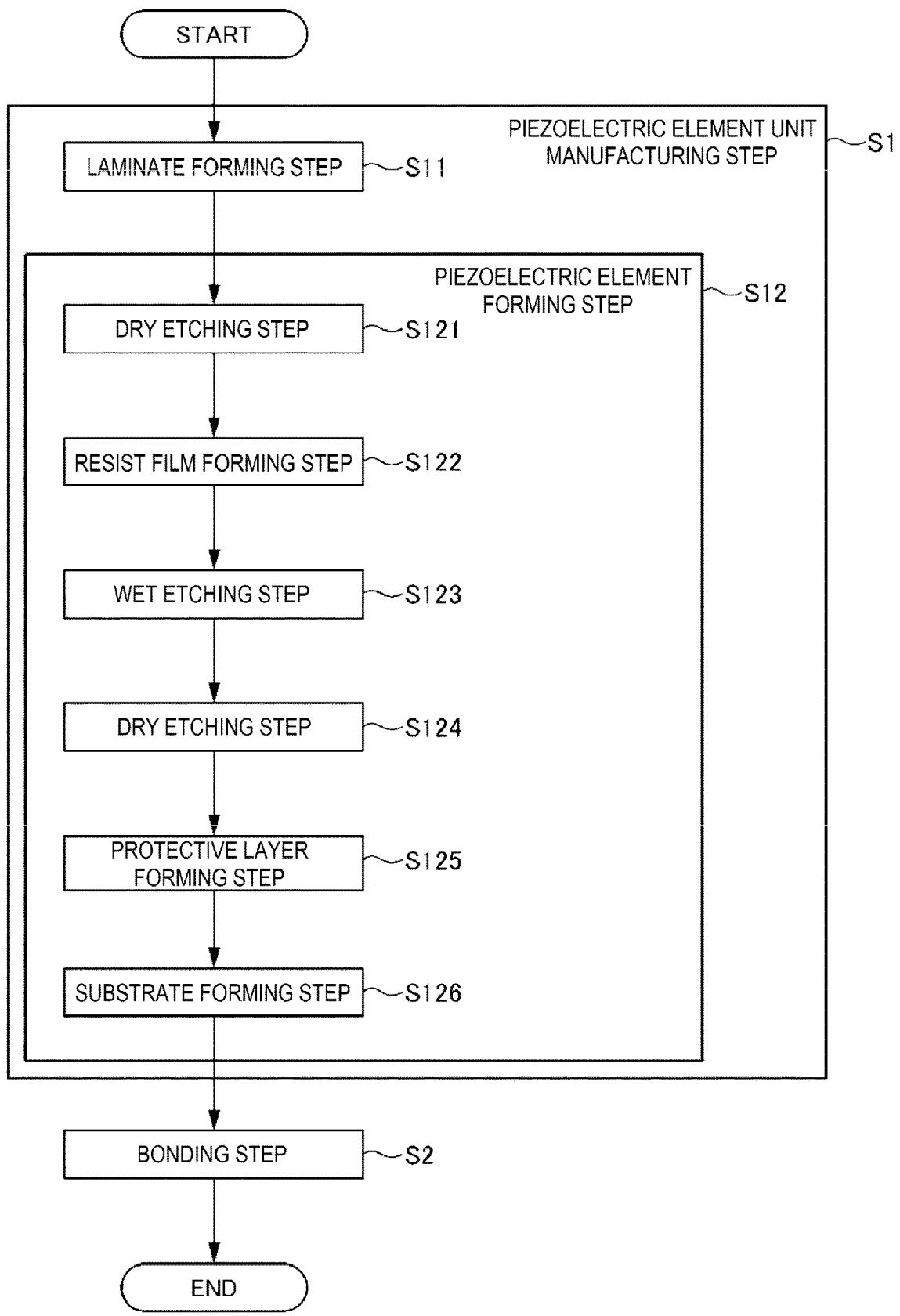
FIG. 10 is a flowchart showing a process of manufacturing the piezoelectric actuator.

FIG. 1 is a plan view showing a piezoelectric motor according to a first embodiment of the present disclosure. FIG. 2 is a plan view showing a piezoelectric actuator included in the piezoelectric motor. FIG. 3 is a cross-sectional view taken along a line A-A in FIG. 2. FIG. 4 is a cross-sectional view taken along a line B-B in FIG. 2. FIG. 5 is a cross-sectional view taken along a line C-C in FIG. 2. FIG. 6 is a cross-sectional view showing a piezoelectric element included in the piezoelectric actuator. FIG. 7 is a diagram showing a signal applied to the piezoelectric actuator. FIGS. 8 and 9 are plan views showing a driving state of the piezoelectric actuator. FIG. 10 is a flowchart showing a process of manufacturing the piezoelectric actuator. FIGS. 11 to 21 are cross-sectional views showing a method of manufacturing the piezoelectric actuator.

In the following, for convenience of description, three axes orthogonal to each other are referred to as an X-axis, a Y-axis, and a Z-axis, a direction along the X-axis is also referred to as an X-axis direction, a direction along the Y-axis is also referred to as a Y-axis direction, and a direction along the Z-axis is also referred to as a Z-axis direction. Further, an arrow side of each axis is also referred to as a "plus side", and a side opposite to the arrow is also referred to as a "minus side". Further, the plus side in the X-axis direction is also referred to as "upper" or "upper side", and the minus side in the X-axis direction is also referred to as "lower" or "lower side".

A piezoelectric motor 1 shown in FIG. 1 includes a rotor 2 as a driven member that has a disk shape and can rotate around a central axis O thereof, and a piezoelectric drive device 3 that abuts on an outer circumferential surface 21 of the rotor 2. In such a piezoelectric motor 1, when the piezoelectric drive device 3 is flexed and vibrated, the rotor 2 rotates around the central axis O parallel to the X axis. A configuration of the piezoelectric motor 1 is not limited to a configuration shown in FIG. 1. For example, a plurality of piezoelectric drive devices 3 may be disposed along a circumferential direction of the rotor 2, and the rotor 2 may be rotated by driving the plurality of piezoelectric drive devices 3. Further, the piezoelectric drive device 3 may abut on a main surface 22 of the rotor 2 instead of the outer circumferential surface 21 of the rotor 2. Further, the driven member is not limited to a rotation body such as the rotor 2, and may be, for example, a slider that moves linearly.

Further, the piezoelectric drive device 3 includes a piezoelectric actuator 4, an urging member 8 that urges the piezoelectric actuator 4 toward the rotor 2, and a control device 9 that controls the drive of the piezoelectric actuator 4.

As shown in FIG. 2, the piezoelectric actuator 4 includes a vibration body 41, a support portion 42 for supporting the vibration body 41, a coupling portion 43 coupling the vibration body 41 and the support portion 42, and a convex portion 44 coupled to the vibration body 41 and configured to transmit the vibration of the vibration body 41 to the rotor 2.

The vibration body 41 has a thickness direction in the X-axis direction, has a plate shape extending in a Y-Z plane including the Y-axis and the Z-axis, and flexes and vibrates in an S shape by being flexed in the Z-axis direction while being expanded and contracted in the Y-axis direction. Further, the vibration body 41 has a longitudinal shape whose longitudinal direction is the Y-axis direction, which is an expansion and contraction direction, in a plan view from the X-axis direction. However, the shape of the vibration body 41 is not particularly limited as long as functions thereof can be exhibited.

Further, the vibration body 41 includes driving piezoelectric elements 6A to 6F for flexing and vibrating the vibration body 41, and a detection piezoelectric element 6G for detecting the vibration of the vibration body 41.

The piezoelectric elements 6C and 6D are disposed at a center portion of the vibration body 41 in the Z-axis direction along the longitudinal direction (Y-axis direction) of the vibration body 41. Further, the piezoelectric elements 6A and 6B are disposed side by side in the longitudinal direction of the vibration body 41 on the plus side of the vibration body 41 in the Z-axis direction with respect to the piezoelectric elements 6C and 6D, and the piezoelectric elements 6E and 6F are disposed side by side in the longitudinal direction of the vibration body 41 on the minus side in the Z-axis direction with respect to the piezoelectric elements 6C and 6D. Of these six driving piezoelectric elements 6A to 6F, the piezoelectric elements 6C and 6D are electrically coupled to each other, the piezoelectric elements 6A and 6F are electrically coupled to each other, and the piezoelectric elements 6B and 6E are electrically coupled to each other. As will be described later, alternating voltages having the same frequency and different phases are applied to the piezoelectric elements 6C and 6D, the piezoelectric elements 6A and 6F, and the piezoelectric elements 6B and 6E. By shifting expansion and contraction timings, the vibration body 41 can be flexed and vibrated in an S shape in the plane.

Further, the detection piezoelectric element 6G is located at the center portion of the vibration body 41 and is disposed between the piezoelectric elements 6C and 6D. The piezoelectric element 6G receives an external force corresponding to the vibration of the vibration body 41 accompanying the drive of the piezoelectric elements 6A to 6F, and outputs a signal corresponding to the received external force. Therefore, a vibration state of the vibration body 41 can be detected based on the signal output from the piezoelectric element 6G.

The number and arrangement of the driving piezoelectric elements are not particularly limited, and similarly, the number and arrangement of the detection piezoelectric elements are not particularly limited.

Further, the support portion 42 supports the vibration body 41. The support portion 42 has a U shape that surrounds a proximal end side of the vibration body 41 in the plan view from the X-axis direction. However, a shape and an arrangement of the support portion 42 are not particularly limited as long as functions thereof can be exhibited. Further, the coupling portion 43 couples a portion serving as a node of the flexural vibration of the vibration body 41, specifically, couples a center portion of the vibration body 41 in the Y-axis direction and the support portion 42. The coupling portion 43 includes a first coupling portion 431 located on the minus side in the Z-axis direction with respect to the vibration body 41, and a second coupling portion 432 located on the plus side in the Z-axis direction with respect to the vibration body 41. However, a configuration of the coupling portion 43 is not particularly limited as long as functions thereof can be exhibited.

As shown in FIGS. 3 to 5, the piezoelectric actuator 4 has a configuration in which two piezoelectric element units 5 are bonded to each other while facing each other. Each piezoelectric element unit 5 includes a substrate 51, driving piezoelectric elements 5A, 5B, 5C, 5D, 5E, and 5F and a detection piezoelectric element 5G disposed on the substrate 51, and an insulating protective layer 52 that covers each of the piezoelectric elements 5A to 5G. The substrate 51 is not particularly limited, but for example, a silicon substrate can be used. In the following description, of the two piezoelectric element units 5 shown in FIGS. 3 to 5, the piezoelectric element unit 5 located at the lower part of each diagram will be described as a representative.

Each of the piezoelectric elements 5A to 5G includes a first electrode 53 disposed on the substrate 51, a piezoelectric body 54 disposed on the first electrode 53, and a second electrode 55 disposed on the piezoelectric body 54. The first electrode 53 is commonly provided for the piezoelectric elements 5A to 5G. On the other hand, the piezoelectric body 54 and the second electrode 55 are individually provided on the piezoelectric elements 5A to 5G. The first electrode 53 is electrically coupled to a wiring 57 drawn from the vibration body 41 through the coupling portion 43 to the support portion 42. Further, the second electrode 55 is electrically coupled to a wiring 58 drawn from the vibration body 41 through the coupling portion 43 to the support portion 42 via a through electrode 56. As a result, the first electrode 53 and the second electrode 55 are each drawn to the support portion 42, and can be electrically coupled to the control device 9 at the support portion 42. As will be described later, the wirings 57 and 58 together with the first electrode 53 are formed from a first electrode layer 530.

The two piezoelectric element units 5 are joined to each other via an adhesive 59 with surfaces on sides where the piezoelectric elements 5A to 5G are disposed facing each other. The piezoelectric element units 5 may be used alone. Further, the number of bonded piezoelectric element units is not limited to two, and may be three or more.

Further, the first electrodes 53 of each piezoelectric element 5A are electrically coupled to each other inside the piezoelectric actuator 4 or outside the piezoelectric actuator 4. Further, the second electrodes 55 of the piezoelectric element 5A are electrically coupled to each other via a wiring (not shown). Then, the piezoelectric element 6A is formed of these two piezoelectric elements 5A. The same applies to the other piezoelectric elements 5B to 5G. That is, the piezoelectric element 6B is formed of two piezoelectric elements 5B, the piezoelectric element 6C is formed of two piezoelectric elements 5C, the piezoelectric element 6D is formed of two piezoelectric elements 5D, the piezoelectric element 6E is formed of two piezoelectric elements 5E, the piezoelectric element 6F is formed of two piezoelectric elements 5F, and the piezoelectric element 6G is formed of two piezoelectric elements 5G.

A constituent material of the piezoelectric body 54 is not particularly limited, and, for example, piezoelectric ceramics such as lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, and lead scandium niobate can be used. Further, as the piezoelectric body 54, polyvinylidene fluoride, quartz crystal, or the like may be used in addition to the above-described piezoelectric ceramics. In the present embodiment, lead zirconate titanate (PZT) is used as the constituent material of the piezoelectric body 54. As a result, the piezoelectric body 54 has an excellent piezoelectric effect.

Further, a method of forming the piezoelectric body 54 is not particularly limited, and the piezoelectric body 54 may be formed from a bulk material, or may be formed by a sol-gel method or a sputtering method. In the present embodiment, the piezoelectric body 54 is formed by using the sol-gel method. As a result, the thin piezoelectric body 54 can be formed at low cost. Therefore, it is possible to reduce a thickness and cost of the piezoelectric drive device 3. The sol-gel method is a film forming method in which a sol solution of an organic metal compound is applied to a substrate by spin coating or the like, dried to obtain a gel film, and then fired to obtain a metal oxide film on the substrate.

Here, the piezoelectric body 54 will be described in detail. Since the piezoelectric body 54 is the same for the piezoelectric elements 5A to 5G, the piezoelectric element 5A will be described as a representative below, and the description of the other piezoelectric elements 5B to 5G will be omitted.

As shown in FIG. 6, the piezoelectric body 54 has a dry etched portion 541 located on the second electrode 55 side and a wet etched portion 542 located on the first electrode 53 side with respect to the dry etched portion 541. As will be described in a manufacturing method described later, the dry etched portion 541 is formed by dry etching, and a side surface 5410 thereof is formed of a dry etched surface. On the other hand, the wet etched portion 542 is formed by wet etching, and a side surface 5420 thereof is formed of a wet etched surface. Accordingly, the piezoelectric body 54 is formed of the dry etched portion 541 located on the second electrode 55 side and the wet etched portion 542 located on the first electrode 53 side, and therefore, contour forming accuracy of the piezoelectric body 54 can be improved, and unintended etching of the first electrode 53 and the wirings 57 and 58 can be prevented. Therefore, electrical characteristics of the piezoelectric actuator 4 are stabilized, and deviations from the designed characteristics can be prevented.

If the piezoelectric body 54 is formed only by dry etching, that is, if the piezoelectric body 54 is formed only of the dry etched portion 541, there is an advantage that the contour of the piezoelectric body 54 can be formed with excellent accuracy, but there is a problem that an etching rate is low and a formation rate is slow, and as described above, there is a problem that unintended etching of the first electrode 53 and the wirings 57 and 58 may occur. On the contrary, if the piezoelectric body 54 is formed only by wet etching, that is, if the piezoelectric body 54 is formed of only the wet etched portion 542, there is an advantage that the etching rate is high and the formation rate is fast, and unintended etching of the first electrode 53 and the wirings 57 and 58 can be prevented, but there is a problem that a contour shape of the piezoelectric body 54 is easily deviated from the design. That is, there is a trade-off relationship between the dry etching and the wet etching. Therefore, by combining the dry etched portion 541 and the wet etched portion 542 as in the present embodiment, these effects can be combined.

Further, the dry etched portion 541 is formed in a tapered shape in which a width gradually increases from the second electrode 55 side to the first electrode 53 side. Accordingly, by forming the dry etched portion 541 in the tapered shape, it is possible to prevent a capacitor region Sc of the piezoelectric body 54 from being unintentionally removed in a dry etching step of forming the portion. Further, it is possible to prevent the wet etched portion 542 from invading the capacitor region Sc due to side etching generated during a wet etching step of forming the wet etched portion 542. The capacitor region Sc is a portion sandwiched between the first electrode 53 and the second electrode 55, and refers to a portion on which an electric field acts. As a result, it is possible to prevent a decrease in the piezoelectric effect of the piezoelectric body 54.

A range of the dry etched portion 541 is not particularly limited, but it is preferable as wide as possible as long as the dry etched portion 541 does not reach the first electrode 53. Specifically, for example, when a thickness of the piezoelectric body 54 is T and a thickness of the dry etched portion 541 is T1, $80\% \leq T1/T \leq 95\%$ is preferable, and 90%≤T1/T≤95% is more preferable. As a result, the contour of the piezoelectric body 54 can be formed with more excellent accuracy. Further, the side surface 5410, which is the dry etched surface, has good in-plane uniformity. Therefore, cracks or the like are difficult to generate in the portion. Since such a portion can be formed wider, mechanical strength of the piezoelectric body 54 can be increased.

Returning to FIG. 1, the convex portion 44 is provided at a tip end portion of the vibration body 41 and protrudes from the vibration body 41 to the plus side in the Y-axis direction. Then, the tip end portion of the convex portion 44 is in contact with the outer circumferential surface 21 of the rotor 2. Therefore, the vibration of the vibration body 41 is transmitted to the rotor 2 via the convex portion 44. A constituent material of the convex portion 44 is not particularly limited, and examples thereof include various ceramics such as zirconia, alumina, and titania. As a result, the convex portion 44 having excellent durability is obtained. The convex portion 44 may be provided as needed, and may be replaced with another member.

In such a piezoelectric actuator 4, when, as shown in FIG. 7, an alternating voltage V1 is applied to the piezoelectric elements 6A and 6F, an alternating voltage V2 is applied to the piezoelectric elements 6C and 6D, and an alternating voltage V3 is applied to the piezoelectric elements 6B and 6E, as shown in FIG. 8, the vibration body 41 expands and contracts in the Y-axis direction and flexes and vibrates in an anti-S-shape in the Z-axis direction, these vibrations are combined, and the tip end of the convex portion 44 makes an elliptical movement that draws an elliptical orbit counterclockwise as shown by an arrow A1. The elliptical movement of the convex portion 44 causes the rotor 2 to be sent out, and the rotor 2 rotates clockwise as shown by an arrow B1. Further, a detection signal Ss is output from the piezoelectric element 6G in response to the vibration of the vibration body 41.

Further, when the alternating voltages V1 and V3 are switched, that is, when the alternating voltage V1 is applied to the piezoelectric elements 6B and 6E, the alternating voltage V2 is applied to the piezoelectric elements 6C and 6D, and the alternating voltage V3 is applied to the piezoelectric elements 6A and 6F, as shown in FIG. 9, the vibration body 41 expands and contracts in the Y-axis direction and flexes and vibrates in an S shape in the Z-axis direction, these vibrations are combined, and the convex portion 44 makes an elliptical movement clockwise as shown by the arrow A2. The elliptical movement of the convex portion 44 causes the rotor 2 to be sent out, and the rotor 2 rotates counterclockwise as shown by an arrow B2. Further, the detection signal Ss is output from the piezoelectric element 6G in response to the vibration of the vibration body 41.

The alternating voltages V1, V2, and V3 are applied to the piezoelectric elements 6A to 6F by the control device 9.

The piezoelectric motor 1 has been described above. Next, a method of manufacturing the piezoelectric actuator 4 will be described with reference to FIGS. 10 to 21. As shown in FIG. 10, a process of manufacturing the piezoelectric actuator 4 includes a piezoelectric element unit manufacturing step S1 for manufacturing the piezoelectric element unit 5 and a bonding step S2 for bonding two piezoelectric element units 5 to obtain the piezoelectric actuator 4.

Further, the piezoelectric element unit manufacturing step S1 includes: a laminate forming step S11 of preparing a laminate 50 including the substrate 51, the first electrode layer 530 disposed on the substrate 51, a piezoelectric layer 540 disposed on the first electrode layer 530, and a second electrode layer 550 disposed on the piezoelectric layer 540; and a piezoelectric element forming step S12 of etching the piezoelectric layer 540 to form the piezoelectric elements 5A to 5G.

Further, the piezoelectric element forming step S12 includes: a dry etching step S121 of dry etching the second electrode layer 550 and the piezoelectric layer 540; a resist film forming step S122 of forming a resist film R2 on a side surface of the piezoelectric layer 540 formed by the dry etching; a wet etching step S123 of wet etching the piezoelectric layer 540; a dry etching step S124 of dry etching the first electrode layer 530; a protective layer forming step S125 of forming the protective layer 52; and a substrate forming step S126 of etching a silicon wafer 510 to form the substrate 51.

Hereinafter, the method of manufacturing the piezoelectric actuator 4 will be specifically described with reference to the cross-sectional view shown in FIG. 3. Therefore, the driving piezoelectric elements 6B, 6D, and 6F and the detection piezoelectric element 6G are not shown, but are formed in the same manner as the shown piezoelectric elements 6A, 6C, and 6E.

Piezoelectric Element Unit Manufacturing Step S1
Laminate Forming Step S11

Figure 11:
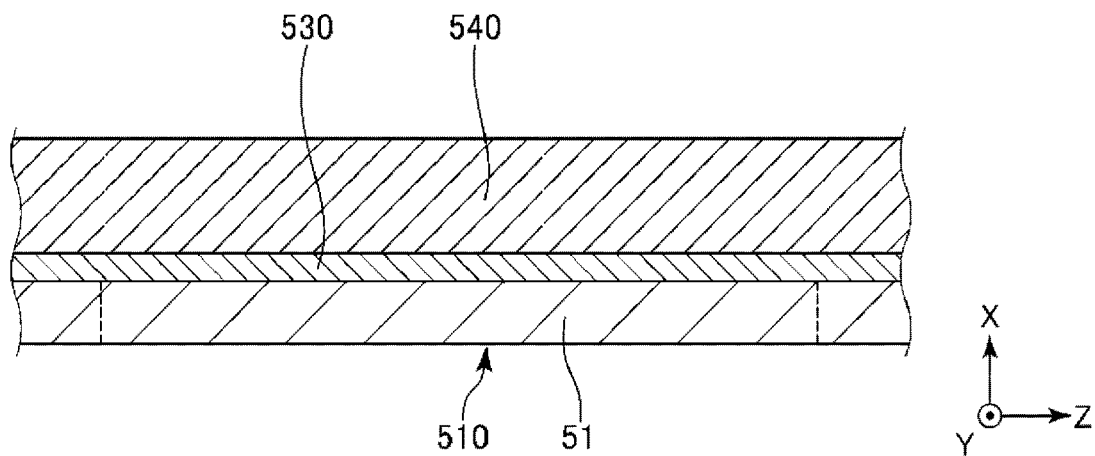
FIG. 11 is a cross-sectional view showing a method of manufacturing the piezoelectric actuator.

First, as shown in FIG. 11, the silicon wafer 510 as a base material of the substrate 51 is prepared, the first electrode layer 530, the piezoelectric layer 540, and the second electrode layer 550 are formed in this order on an upper surface of the substrate 51, and the laminate 50 is formed. Although not shown, a plurality of laminates 50 are collectively formed from one silicon wafer 510.

Specifically, first, a film of a metal material such as Pt and Cr is formed on the entire substrate 51 by a sputtering method to form the first electrode layer 530 as a base material for the first electrode 53 and the wirings 57 and 58.

Next, a film of a piezoelectric material is formed on the first electrode layer 530 by a sol-gel method to form the piezoelectric layer 540 as a base material of the piezoelectric body 54. By using the sol-gel method, the thin piezoelectric layer 540 can be formed. Therefore, the piezoelectric actuator 4 can be made thinner. Further, since a film can be formed in a non-vacuum atmosphere, the piezoelectric layer 540 can be formed at low cost. The piezoelectric material is not particularly limited, but in the present embodiment, lead zirconate titanate (PZT) is used. As a result, the piezoelectric body 54 has an excellent piezoelectric effect.

Figure 12:
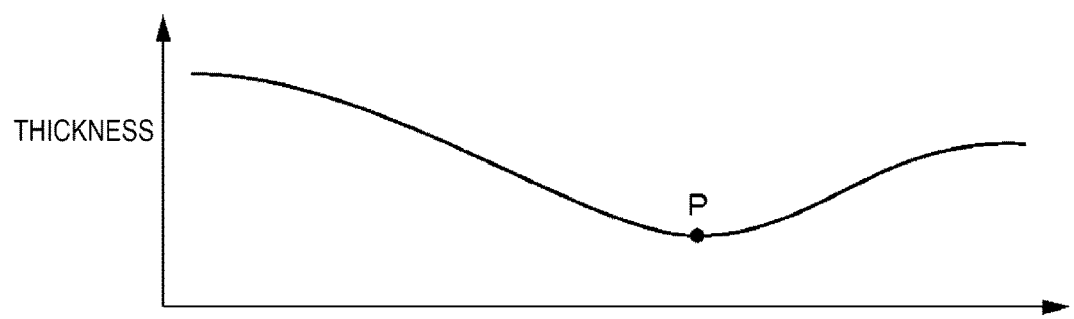
FIG. 12 is a cross-sectional view showing the method of manufacturing the piezoelectric actuator.
Figure 12:
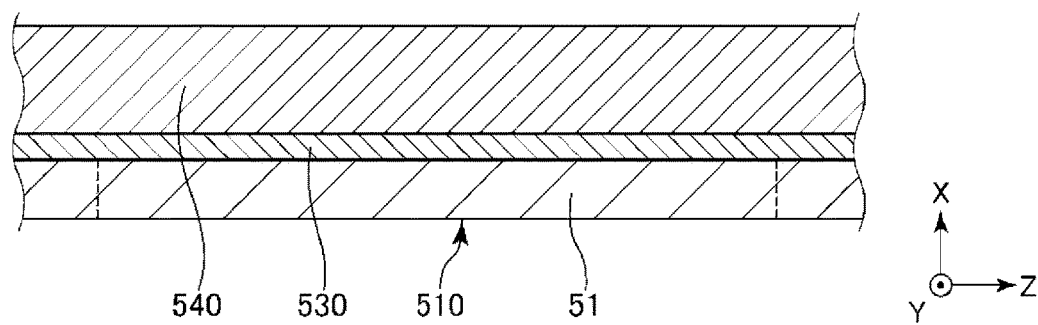

Next, as shown in FIG. 12, a thickness distribution of the piezoelectric layer 540 is measured. A method of measuring the thickness distribution is not particularly limited, and for example, the thickness distribution can be measured by optical film thickness measurement.

Figure 13:
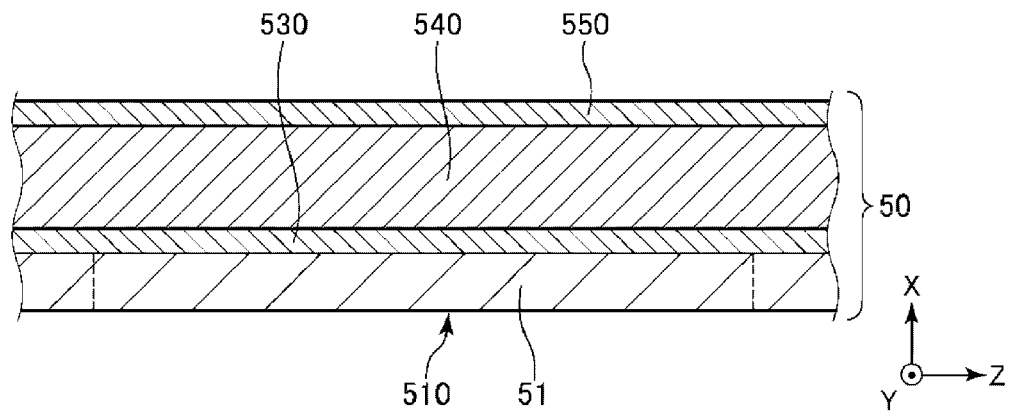
FIG. 13 is a cross-sectional view showing the method of manufacturing the piezoelectric actuator.

Next, as shown in FIG. 13, a film of a metal material such as Pt and Cr is formed on the piezoelectric layer 540 by the sputtering method to form the second electrode layer 550 as a base material of the second electrode 55. From the above, the laminate 50 is obtained.

Piezoelectric Element Forming Step S12
Dry Etching Step S121

Figure 14:
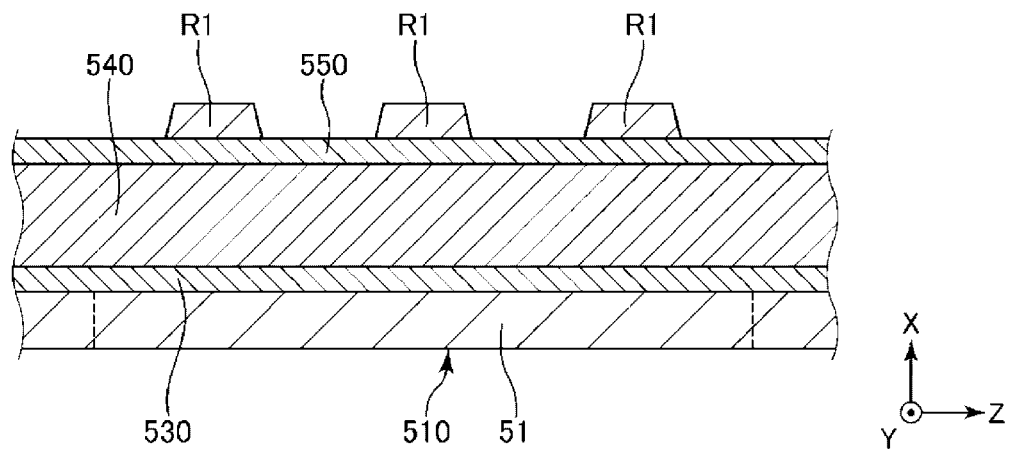
FIG. 14 is a cross-sectional view showing the method of manufacturing the piezoelectric actuator.

Next, as shown in FIG. 14, a resist film R1 corresponding to a pattern of the second electrode 55 is formed on the second electrode layer 550. The resist film R1 is a mask for dry etching. Therefore, a material of the resist film R1 is not particularly limited as long as the material has dry etching resistance. The resist film R1 has a tapered shape whose width gradually decreases upward. Since the resist film R1 has a tapered shape, shavings generated during dry etching can be easily removed from an etched portion, the accuracy and the speed of dry etching are improved, and the surface, that is, the side surface 5410 formed by the dry etching becomes smoother. However, the shape of the resist film R1 is not limited thereto, and the side surface may stand vertically.

Figure 15:
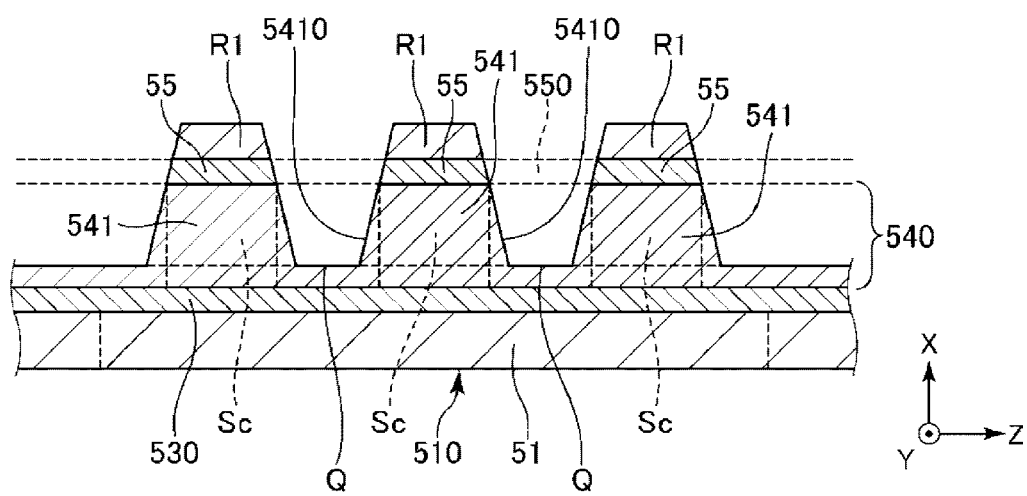
FIG. 15 is a cross-sectional view showing the method of manufacturing the piezoelectric actuator.

Next, as shown in FIG. 15, the second electrode layer 550 and the piezoelectric layer 540 are dry-etched via the resist film R1. The dry etching is not particularly limited, but in the present embodiment, an ion milling method in which etching is performed by irradiation with an ion beam is used. However, the method is not limited thereto, and for example, a reactive ion etching method (RIE) may be used.

In this step, the piezoelectric layer 540 is dug halfway in the thickness direction. That is, this step is completed at the stage where the piezoelectric layer 540 is dug halfway in the thickness direction, in other words, before a groove Q formed by dry etching reaches the first electrode layer 530. The first electrode layer 530 made of a metal material has low resistance to the dry etching in this step. Therefore, by ending the dry etching before the groove Q reaches the first electrode layer 530, it is possible to prevent the first electrode layer 530 from being unintentionally removed by etching in this step.

If the dry etching is continued until the groove Q reaches the first electrode layer 530, the first electrode layer 530 is unintentionally overetched, and a thickness of the first electrode 53 or the wirings 57 and 58 is reduced to increase electrical resistance, or in severe cases, the wire is broken. Therefore, the electrical characteristics deviate greatly from the designed characteristics, and the piezoelectric actuator 4 may not be able to exhibit the desired characteristics or the drive may be unstable. Further, by preventing the increase in the electrical resistance of the wirings 57 and 58 due to overetching, the weak detection signal Ss can be received with high accuracy.

In the present embodiment, a thickness distribution of the piezoelectric layer 540 is measured in the laminate forming step S11. Therefore, for example, at the thinnest portion of a region where the groove Q of the piezoelectric layer 540 is formed, at a point P in FIG. 12, an etching time may be set such that the dry etching is completed before the groove Q formed in the portion reaches the first electrode layer 530. Depending on a dry etching apparatus and an ion milling apparatus in the present embodiment, the etching rate may vary in the silicon wafer 510, for example, the etching rate is slower in an outer peripheral portion than in a center portion of the wafer. Therefore, when an apparatus having such characteristics is used, it is preferable to set the etching time in consideration of not only the thickness distribution of the piezoelectric layer 540 described above but also the apparatus characteristics.

Further, although not particularly limited, in this step, it is preferable to dig the piezoelectric layer 540 to a thickness of 80% or more and 95% or less of the thickness of the piezoelectric layer 540, and more preferably to dig the piezoelectric layer 540 to a thickness of 90% or more and 95% or less. As a result, a larger range can be dug by dry etching while preventing the groove Q from reaching the first electrode layer 530. As a result, the contour of each piezoelectric body 54 can be formed with excellent accuracy. Further, the side surface 5410, which is the dry etched surface, has good in-plane uniformity. Therefore, cracks or the like are difficult to generate in the portion. Since such a portion can be formed wider, the mechanical strength of the piezoelectric body 54 can be increased.

When the thickness distribution of the piezoelectric layer 540 is not measured in the laminate forming step S11, since the point P cannot be used as a reference, the etching time may be set such that the piezoelectric layer 540 can be dug to a thickness of 80% or more and 95% or less based on a design film thickness of the piezoelectric layer 540. Table 1 below shows experimental data for verifying the variation in an etching depth of the piezoelectric layer 540. As can be seen from the table, the maximum etching depth is approximately 105% of an average etching depth. Therefore, by setting the etching depth to 80% or more and 95% or less of the piezoelectric layer 540, it is possible to prevent the groove Q from reaching the first electrode layer 530 even at a position where the etching depth is maximum.

TABLE 1

| Etching time (min) | Etching depth (mm) | | | Maximum depth/average depth |
|---|---|---|---|---|
| | Average depth | Maximum depth | Minimum depth | |
| 25 | 482.0 | 515.3 | 457.5 | 106% |
| 50 | 984.2 | 1036.0 | 919.5 | 105% |
| 100 | 2021.9 | 2115.5 | 1930.8 | 104% |
| 140 | 2907.0 | 3006.5 | 2817.3 | 103% |

By the above steps, the second electrode 55 is formed and the dry etched portion 541 of the piezoelectric body 54 is formed. The dry etched portion 541 has a wider tapered shape on the first electrode 53 side than on the second electrode 55 side. In particular, in the present embodiment, the width gradually increases from the second electrode 55 side to the first electrode 53 side in a tapered shape. By forming the dry etched portion 541 into a tapered shape, it is possible to prevent the capacitor region Sc of the piezoelectric layer 540 from being unintentionally removed in this step. Further, the mechanical strength of the piezoelectric body 54 can be increased by having a tapered shape. Further, in the subsequent wet etching step, it is possible to prevent the groove Q from invading the capacitor region Sc.

Resist Film Forming Step S122

Figure 16:
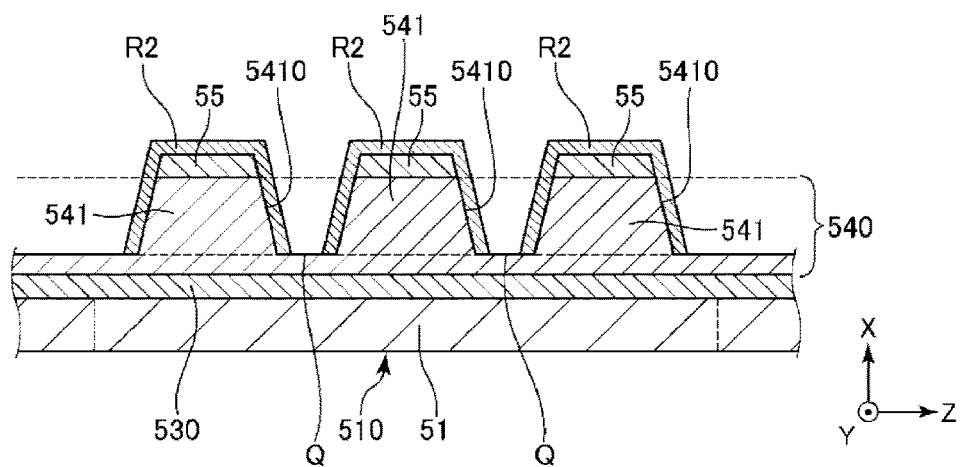
FIG. 16 is a cross-sectional view showing the method of manufacturing the piezoelectric actuator.

Next, as shown in FIG. 16, the resist film R2 covering the second electrode 55 and the dry etched portion 541 is formed. The resist film R2 is a mask for wet etching. Therefore, a material of the resist film R2 is not particularly limited as long as the material has wet etching resistance.

Wet Etching Step S123

Figure 17:
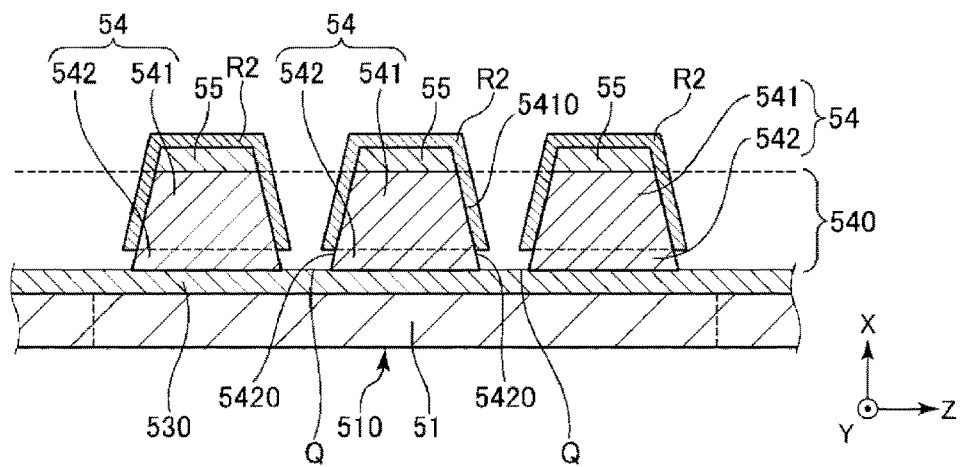
FIG. 17 is a cross-sectional view showing the method of manufacturing the piezoelectric actuator.

Next, as shown in FIG. 17, the piezoelectric layer 540 is wet-etched via the resist film R2. In this step, the piezoelectric layer 540 is dug until the groove Q reaches the first electrode layer 530. As a result, the piezoelectric layer 540 is divided into seven parts, and the piezoelectric bodies 54 of the piezoelectric elements 5A to 5G are formed. Here, the first electrode layer 530 made of a metal material has sufficient wet etching resistance. Therefore, even if a wet etching solution comes into contact with the first electrode layer 530, the first electrode layer 530 is not substantially removed. Therefore, the problem caused by the above-described dry etching, that is, unintentional overetching of the first electrode layer 530, and the risk of the thickness of the first electrode 53 or the wirings 57 and 58 being reduced to increase the electrical resistance, or the wirings 57 and 58 being broken, is reduced.

The wet etched portion 542 of the piezoelectric body 54 is formed by the above steps. The wet etched portion 542 has a wider tapered shape on the first electrode layer 530 side than on the second electrode layer 550 side. This is because the wet etching is isotropic etching. Here, the wet etched surface, which is the side surface 5420 of the wet etched portion 542, is located outside the capacitor region Sc. In other words, the capacitor region Sc is not removed in the wet etched portion 542. As a result, it is possible to prevent a decrease in the piezoelectric effect of the piezoelectric body 54. Further, the mechanical strength of the piezoelectric body 54 can be increased.

The resist film R2 is formed sufficiently thick such that the capacitor region Sc is not removed by side etching generated during the wet etching. Further, the dry etched portion 541 has a tapered shape, which also helps to prevent the capacitor region Sc from being removed by the side etching.

Dry Etching Step S124

Figure 18:
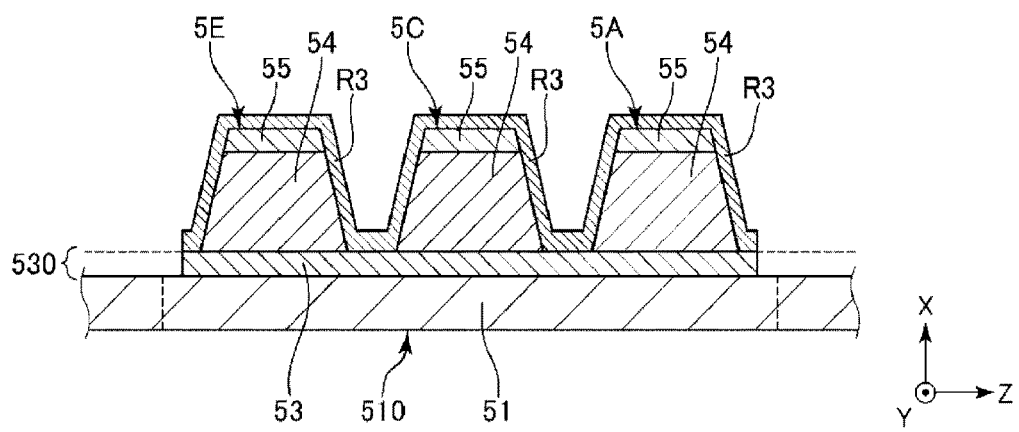
FIG. 18 is a cross-sectional view showing the method of manufacturing the piezoelectric actuator.

Next, as shown in FIG. 18, a resist film R3 covering the second electrode 55 and the piezoelectric body 54 is formed. Then, the first electrode layer 530 is dry-etched through the resist film R3 to form the first electrode 53 and the wirings 57 and 58 from the first electrode layer 530. As a result, the piezoelectric elements 5A to 5G are formed.

Protective Layer Forming Step S125

Figure 19:
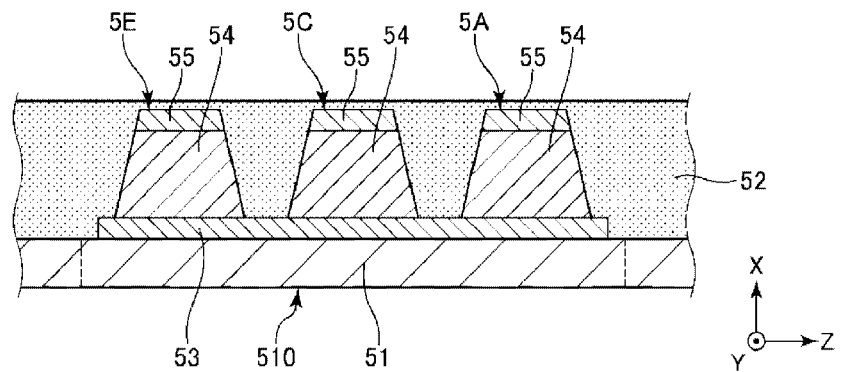
FIG. 19 is a cross-sectional view showing the method of manufacturing the piezoelectric actuator.

Next, as shown in FIG. 19, for example, the protective layer 52 made of a resin material is formed. After that, the through electrode 56, a wiring for coupling the through electrode 56 and the second electrode 55, or the like are formed.

Substrate Forming Step S126

Figure 20:
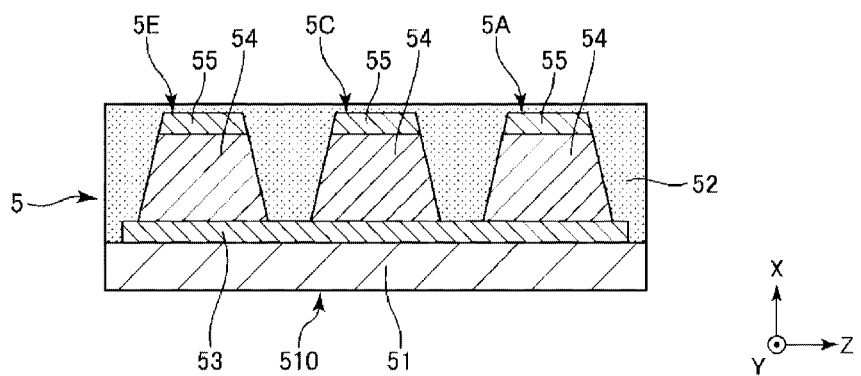
FIG. 20 is a cross-sectional view showing the method of manufacturing the piezoelectric actuator.

Next, as shown in FIG. 20, the silicon wafer 510 is etched to form the substrate 51. As a result, the piezoelectric element unit 5 is obtained.

Bonding Step S2

Figure 21:
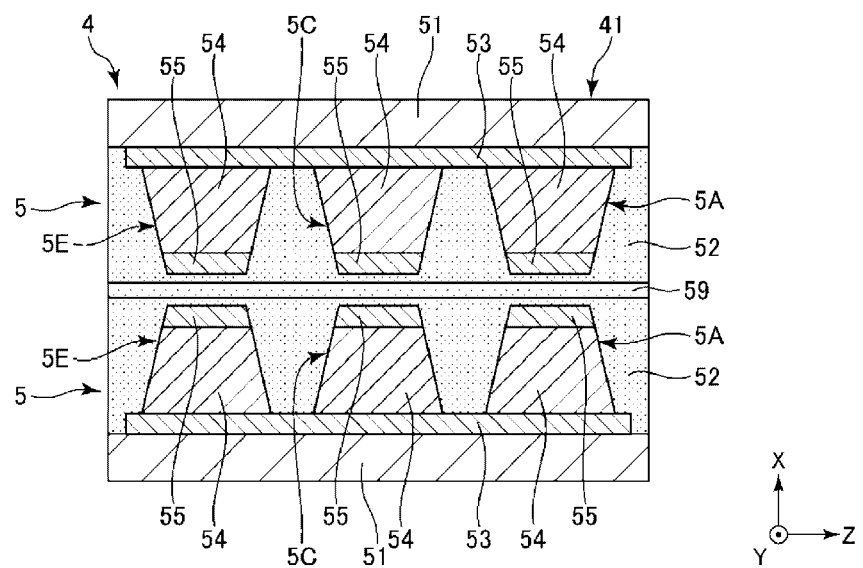
FIG. 21 is a cross-sectional view showing the method of manufacturing the piezoelectric actuator.

Next, as shown in FIG. 21, two piezoelectric element units 5 are prepared and are joined via the adhesive 59. Next, the convex portion 44 is joined to the vibration body 41. From the above, the piezoelectric actuator 4 is manufactured.

The piezoelectric actuator 4 and the manufacturing method thereof have been described above. Such a piezoelectric actuator 4 includes the substrate 51, the first electrode 53 disposed on the substrate 51, the piezoelectric body 54 disposed on the first electrode 53, and the second electrode 55 disposed on the piezoelectric body 54. Further, the piezoelectric body 54 includes the dry etched portion 541 whose side surface 5410 is the dry etched surface, and the wet etched portion 542, which is located on the first electrode 53 side with respect to the dry etched portion 541 and whose side surface 5420 is the wet etched surface. Accordingly, the piezoelectric body 54 is formed of the dry etched portion 541 located on the second electrode 55 side and the wet etched portion 542 located on the first electrode 53 side, and therefore, the contour forming accuracy of the piezoelectric body 54 can be improved, and unintended etching of the first electrode 53 and the wirings 57 and 58 can be prevented. Therefore, the electrical characteristics of the piezoelectric actuator 4 are stabilized, and the deviations from the designed characteristics can be prevented.

Further, as described above, the method of manufacturing the piezoelectric actuator 4 includes: the laminate forming step S11, which is a step of preparing the laminate 50 including the substrate 51, the first electrode layer 530 disposed on the substrate 51, the piezoelectric layer 540 disposed on the first electrode layer 530, and the second electrode layer 550 disposed on the piezoelectric layer 540; and the piezoelectric element forming step S12, which is a step of forming the contour shape of the piezoelectric layer 540. Further, the piezoelectric element forming step S12 includes: the dry etching step S121, which is a step of dry etching the piezoelectric layer 540 from the second electrode layer 550 side to dig the piezoelectric layer 540 halfway in the thickness direction; the resist film forming step S122, which is a step of covering, with the resist film R2, the dry etched surface formed on the side surface of the piezoelectric layer 540 by the dry etching; the wet etching step S123, which is a step of wet etching the piezoelectric layer 540 from the second electrode layer 550 side to dig the piezoelectric layer 540 until the first electrode layer 530 is reached. According to such a manufacturing method, it is possible to prevent unintended etching of the first electrode 53 and the wirings 57 and 58 while improving the contour forming accuracy of the piezoelectric body 54. Therefore, the electrical characteristics of the piezoelectric actuator 4 are stabilized, and the deviations from the designed characteristics can be prevented.

Further, as described above, the piezoelectric layer 540 is a film of lead zirconate titanate formed by the sol-gel method. As a result, the piezoelectric layer 540 having an excellent piezoelectric effect can be obtained. Further, the piezoelectric layer 540 can be formed to be thin.

Further, as described above, in the dry etching step S121, the piezoelectric layer 540 is dug to a thickness of 80% or more and 95% or less of the thickness of the piezoelectric layer 540. As a result, the contour forming accuracy of the piezoelectric body 54 can be improved.

Further, as described above, the method of manufacturing the piezoelectric actuator 4 includes a step of measuring the thickness distribution of the piezoelectric layer 540 prior to the dry etching step S121. As a result, in the dry etching step S121, it is possible to prevent the dry etching from reaching the first electrode layer 530.

Further, as described above, the wet etched surface formed on the side surface of the piezoelectric layer 540 by the wet etching is located outside the capacitor region Sc, which is a region where the first electrode 53 formed from the first electrode layer 530 and the second electrode 55 formed from the second electrode layer 550 overlap each other. As a result, the piezoelectric body 54 formed from the piezoelectric layer 540 can exhibit an excellent piezoelectric effect.

Further, as described above, the dry etched portion 541 formed on the piezoelectric layer 540 by the dry etching step S121 is wider on the first electrode layer 530 side than on the second electrode layer 550 side. As a result, it is possible to prevent the removal of the capacitor region Sc of the dry etched portion 541.

Further, as described above, the piezoelectric layer 540 is divided into a plurality of parts by the piezoelectric element forming step S12, and the plurality of divided piezoelectric layers 540 include the driving piezoelectric body 54 that deforms the substrate 51 and the detection piezoelectric body 54 that detects the deformation of the substrate 51. The driving piezoelectric body 54 refers to the piezoelectric bodies 54 of the piezoelectric elements 5A to 5E, and the detection piezoelectric body 54 refers to the piezoelectric body 54 of the piezoelectric element 5G. The detection signal Ss output from the piezoelectric element 5G is very weak. Therefore, the detection signal Ss can be received with high accuracy by preventing the increase in the electrical resistance of the wirings 57 and 58 due to overetching.

Second Embodiment

Figure 22:
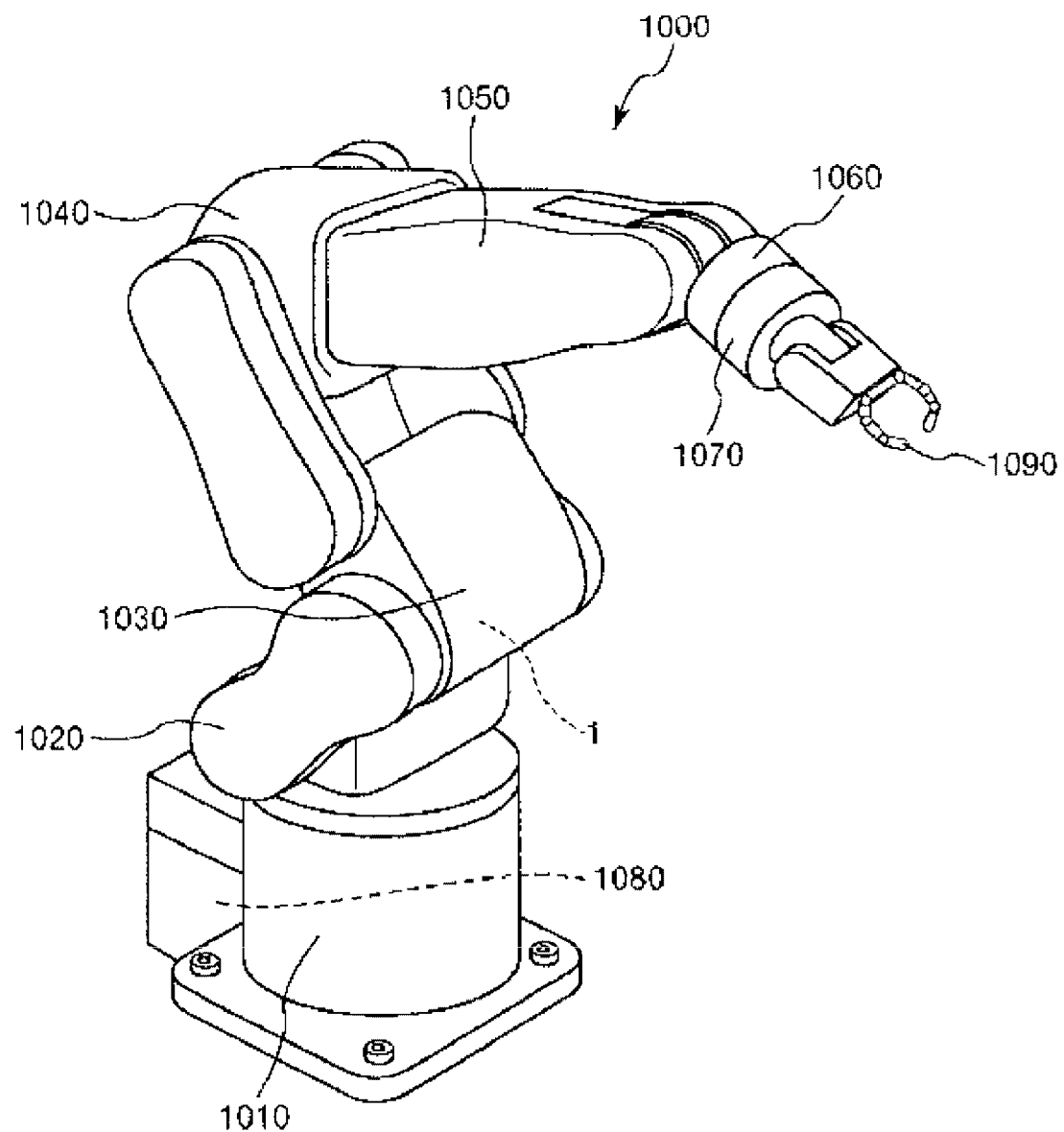
FIG. 22 is a perspective view showing a robot according to a second embodiment of the present disclosure.

FIG. 22 is a perspective view showing a robot according to a second embodiment of the present disclosure.

A robot 1000 shown in FIG. 22 can perform operations such as supplying, removing, transporting, and assembling precision equipment and constituent parts thereof. The robot 1000 is a 6-axis robot, and includes a base 1010 fixed to a floor or a ceiling, an arm 1020 rotatably coupled to the base 1010, an arm 1030 rotatably coupled to the arm 1020, an arm 1040 rotatably coupled to the arm 1030, an arm 1050 rotatably coupled to the arm 1040, an arm 1060 rotatably coupled to the arm 1050, an arm 1070 rotatably coupled to the arm 1060, and a control device 1080 for controlling drive of these arms 1020, 1030, 1040, 1050, 1060, and 1070.

Further, the arm 1070 is provided with a hand coupling portion, and the hand coupling portion is equipped with an end effector 1090 according to the operation to be executed by the robot 1000. Further, all or a part of each joint portion is equipped with the piezoelectric motor 1 including the piezoelectric actuator 4, and the drive of the piezoelectric motor 1 rotates each arm 1020, 1030, 1040, 1050, 1060, and 1070. The piezoelectric motor 1 may be mounted on the end effector 1090 and may be used to drive the end effector 1090.

Further, the control device 1080 is formed of a computer, and includes, for example, a processor (CPU), a memory, an I/F (interface), or the like. Then, the processor controls the drive of each portion of the robot 1000 by executing a predetermined program (code string) stored in the memory. The program may be downloaded from an external server via the I/F. Further, all or a part of a configuration of the control device 1080 may be provided outside the robot 1000 and connected via a communication network such as a LAN (local area network).

The robot 1000 has been described above. Such a robot 1000 includes the piezoelectric actuator 4 as described above. As a result, the robot 1000 can enjoy the effects of the piezoelectric actuator 4 described above and has high reliability.

Third Embodiment

Figure 23:
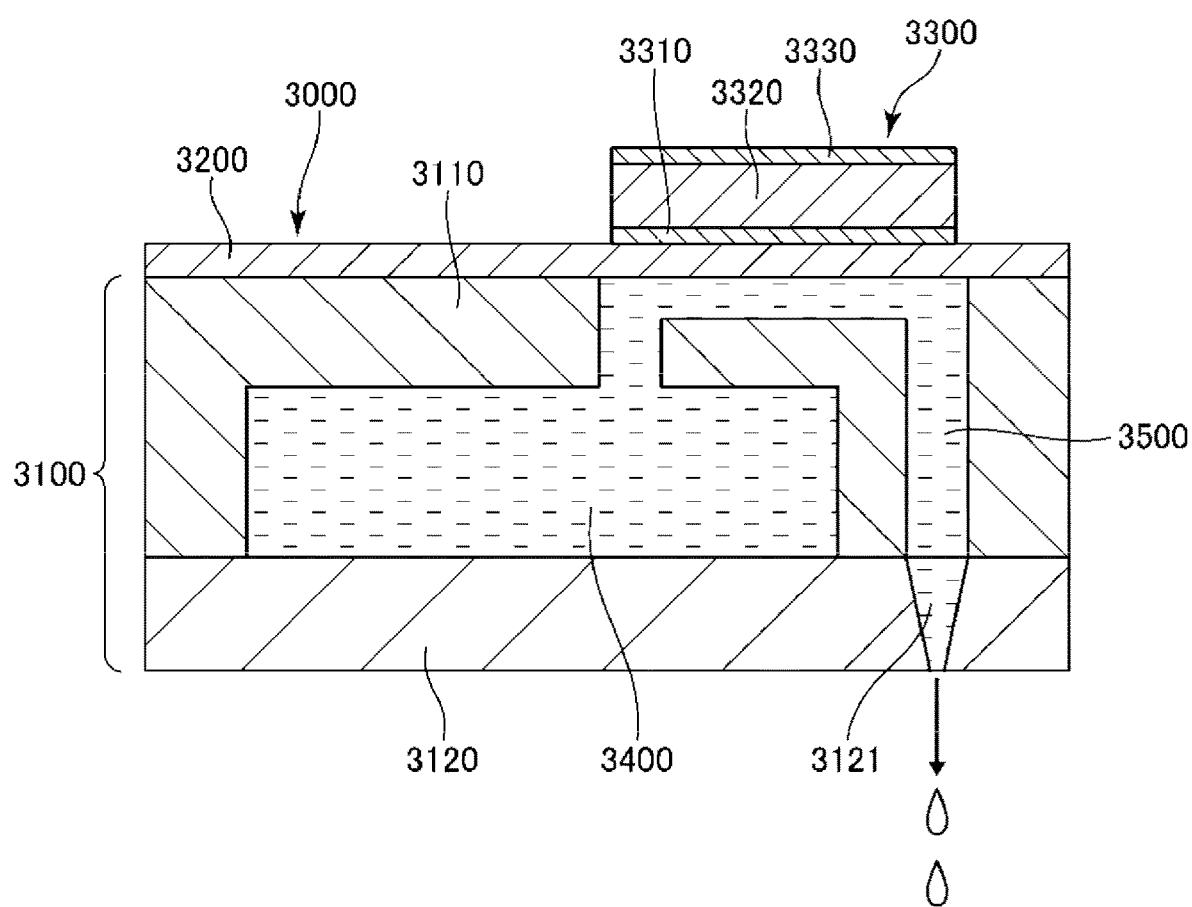
FIG. 23 is a cross-sectional view showing an inkjet head according to a third embodiment of the present disclosure.

FIG. 23 is a cross-sectional view showing an inkjet head according to a third embodiment of the present disclosure.

An inkjet head 3000 shown in FIG. 23 ejects ink from a nozzle by a droplet ejection method. The inkjet head 3000 includes a head body 3100, a vibration plate 3200, and a piezoelectric element 3300. The head body 3100 includes a substrate 3110 and a nozzle plate 3120. Then, by sandwiching the substrate 3110 between the nozzle plate 3120 and the vibration plate 3200, a reservoir 3400 and a plurality of ink chambers 3500 branched from the reservoir 3400 are formed. In FIG. 23, only one ink chamber 3500 is shown, but in reality, a plurality of ink chambers 3500 are formed along a depth direction of a paper surface.

Further, the nozzle plate 3120 is formed with a nozzle 3121 for ejecting the ink in the ink chamber 3500. The vibration plate 3200 is mounted on an upper end surface of the head body 3100 and forms a wall surface of each ink chamber 3500. The vibration plate 3200 can vibrate in response to the vibration of the piezoelectric element 3300. The piezoelectric element 3300 includes a first electrode 3310 disposed on the vibration plate 3200, a piezoelectric body 3320 disposed on the first electrode 3310, and a second electrode 3330 disposed on the piezoelectric body 3320. The piezoelectric element 3300 has the same configuration and is formed by the same method as the piezoelectric elements 5A to 5G of the first embodiment described above.

When a drive signal is applied to the piezoelectric element 3300 to expand and contract the piezoelectric element 3300, as a pressure in the ink chamber 3500 rises and falls, the ink flows from the reservoir 3400 into the ink chamber 3500, and the ink is ejected from the nozzle 3121.

According to the present embodiment as described above, the same effects as those of the first embodiment can be exerted.

The method of manufacturing the piezoelectric actuator, the piezoelectric actuator, and the robot according to the present disclosure have been described above based on the illustrated embodiments. However, the present disclosure is not limited thereto. A configuration of each part can be replaced with any configuration having the same function. Further, any other constituents may be added to the present disclosure. Further, each of the embodiments may be combined as appropriate.

What is claimed is:

1. A method of manufacturing a piezoelectric actuator, comprising:
    preparing a laminate including a substrate, a first electrode layer disposed on the substrate, a piezoelectric layer disposed on the first electrode layer, and a second electrode layer disposed on the piezoelectric layer; and
    forming a contour shape of the piezoelectric layer, wherein
    forming of the contour shape comprising:
        dry etching the piezoelectric layer from the second electrode layer side towards the first electrode layer side by dry etching the piezoelectric layer in the thickness direction,
        wherein in the dry etching, the piezoelectric layer is dry etched to a thickness between 80% and 95% of the thickness of the piezoelectric layer,
        covering, with a resist film, a dry etched surface formed on a side surface of the piezoelectric layer by the dry etching, and
        wet etching the piezoelectric layer from the second electrode layer side to wet etch the piezoelectric layer until the first electrode layer is reached.

2. The method of manufacturing a piezoelectric actuator according to claim 1, wherein
    the piezoelectric layer is a film of lead zirconate titanate formed by a sol-gel method.

3. The method of manufacturing a piezoelectric actuator according to claim 1, further comprising:
    measuring a thickness distribution of the piezoelectric layer prior to the dry etching.

4. The method of manufacturing a piezoelectric actuator according to claim 1, wherein
    a wet etched surface formed on the side surface of the piezoelectric layer by the wet etching is located outside a region where a first electrode formed from the first electrode layer and a second electrode formed from the second electrode layer overlap each other.

5. The method of manufacturing a piezoelectric actuator according to claim 1, wherein
    a dry etched piezoelectric layer portion formed on the piezoelectric layer by the dry etching is wider on the first electrode layer side than on the second electrode layer side.

6. The method of manufacturing a piezoelectric actuator according to claim 1, wherein
    the piezoelectric layer is divided into a plurality of parts by forming the contour shape, and
    the divided plurality of parts include a driving piezoelectric body that deforms the substrate and a detection piezoelectric body that detects a deformation of the substrate.

7. A piezoelectric actuator, comprising:
a substrate;
a first electrode disposed on the substrate;
a piezoelectric body disposed on the first electrode; and
a second electrode disposed on the piezoelectric body, wherein
the piezoelectric body includes:
- a dry etched portion whose side surface is a dry etched surface, and
- a wet etched portion which is located on the first electrode side with respect to the dry etched portion and having a wet etched side surface, wherein the piezoelectric body is formed by dry etching and wet etching a piezoelectric layer, the dry etched portion of the piezoelectric body is formed by dry etching the piezoelectric layer to a thickness between 80% and 95% of the thickness of the piezoelectric layer in dry etching.

8. A robot comprising:
the piezoelectric actuator according to claim 7.

* * * * *